US009433118B2

(12) United States Patent
Senatori

(10) Patent No.: US 9,433,118 B2
(45) Date of Patent: Aug. 30, 2016

(54) MOUNTING FRAME AND SUPPORTS TO MOUNT A COMPONENT OF A COMPUTING SYSTEM

(75) Inventor: Mark David Senatori, The Woodlands, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 208 days.

(21) Appl. No.: 14/124,293

(22) PCT Filed: Jun. 8, 2011

(86) PCT No.: PCT/US2011/039623
§ 371 (c)(1),
(2), (4) Date: Dec. 6, 2013

(87) PCT Pub. No.: WO2012/170022
PCT Pub. Date: Dec. 13, 2012

(65) Prior Publication Data
US 2014/0110546 A1    Apr. 24, 2014

(51) Int. Cl.
*A47B 96/06* (2006.01)
*H05K 7/14* (2006.01)
*G06F 1/18* (2006.01)
*G11B 33/12* (2006.01)
*H05K 13/04* (2006.01)

(52) U.S. Cl.
CPC ............... *H05K 7/14* (2013.01); *G06F 1/186* (2013.01); *G06F 1/187* (2013.01); *G11B 33/124* (2013.01); *H05K 13/04* (2013.01); *Y10T 29/49826* (2015.01)

(58) Field of Classification Search
CPC combination set(s) only.
See application file for complete search history.

(56) References Cited

U.S. PATENT DOCUMENTS

| 5,124,855 A * | 6/1992 | Dew ................... G11B 33/121 360/137 |
| 5,463,527 A * | 10/1995 | Hager ................... G11B 33/08 248/581 |
| 5,654,875 A * | 8/1997 | Lawson ............... G11B 33/124 248/638 |
| 5,921,644 A | 7/1999 | Brunel et al. |
| 5,958,212 A * | 9/1999 | Yamamura ............. G11B 33/08 205/723 |
| 6,122,164 A | 9/2000 | Liao et al. |
| 6,166,901 A * | 12/2000 | Gamble ................. G06F 1/184 248/560 |
| 6,671,180 B2 * | 12/2003 | Le .......................... G06F 1/184 361/726 |
| 7,009,838 B2 | 3/2006 | Roh |
| 7,471,509 B1 * | 12/2008 | Oliver .................. G11B 25/043 312/223.2 |
| 7,511,953 B2 * | 3/2009 | Tao ........................ G06F 1/187 361/679.39 |
| 7,518,859 B2 | 4/2009 | Kobayashi |
| 7,551,433 B2 * | 6/2009 | Hammer ................ G06F 1/187 361/679.36 |

(Continued)

FOREIGN PATENT DOCUMENTS

| CN | 101593001 | 12/2009 |
| KR | 10-2002-0072751 A | 9/2002 |
| WO | WO-2007/126239 A1 | 11/2007 |

OTHER PUBLICATIONS

International Search Report and Written Opinion, International Application No. PCT/US2011/039623, Date of Completion: Jan. 20, 2012, Date of Mailing: Feb. 9, 2012, pp. 1-6.

*Primary Examiner* — Monica Millner
(74) *Attorney, Agent, or Firm* — HP Inc Patent Departmetn

(57) ABSTRACT

A mounting frame for a component of a computing system includes first supports and second supports. The first supports are to contact a top surface of the component at a first height relative to the mounting frame, and the second supports are to contact the top surface of the component at a second height relative to the mounting frame.

21 Claims, 7 Drawing Sheets

(56) References Cited

U.S. PATENT DOCUMENTS

| | | | | |
|---|---|---|---|---|
| 7,630,197 B2* | 12/2009 | Chen | | G11B 33/124 312/223.1 |
| 7,911,778 B2* | 3/2011 | Merrow | | G11B 19/042 312/223.1 |
| 8,300,352 B1* | 10/2012 | Larson | | G11B 25/043 360/97.11 |
| 9,135,957 B2* | 9/2015 | Grobe | | G11B 33/24 |
| 2002/0044416 A1* | 4/2002 | Harmon, III | | G11B 33/08 361/679.36 |
| 2002/0167792 A1* | 11/2002 | Osterhout | | G11B 33/08 361/679.34 |
| 2003/0011980 A1* | 1/2003 | Albrecht | | G06F 1/187 361/679.34 |
| 2003/0174464 A1* | 9/2003 | Funawatari | | G11B 33/08 361/679.36 |
| 2004/0169996 A1 | 9/2004 | Paul et al. | | |
| 2004/0255313 A1* | 12/2004 | Kaczeus, Sr. | | G06F 1/187 720/651 |
| 2005/0088778 A1* | 4/2005 | Chen | | G06F 1/184 360/97.19 |
| 2006/0002076 A1* | 1/2006 | Albrecht | | G11B 33/08 361/679.34 |
| 2007/0025014 A1* | 2/2007 | Kim | | G06F 1/187 360/97.19 |
| 2007/0133121 A1* | 6/2007 | Xu | | G11B 33/08 360/97.19 |
| 2007/0188989 A1 | 8/2007 | Paul et al. | | |
| 2009/0064288 A1 | 3/2009 | Bagepalli et al. | | |
| 2009/0097195 A1 | 4/2009 | Colligan | | |
| 2010/0011386 A1* | 1/2010 | Fukasawa | | G11B 5/59627 720/692 |
| 2010/0058232 A1 | 3/2010 | De Silva | | |
| 2010/0259885 A1 | 10/2010 | Zheng et al. | | |
| 2011/0002213 A1 | 1/2011 | Ogatsu et al. | | |
| 2011/0005068 A1 | 1/2011 | Zhang et al. | | |
| 2011/0035494 A1 | 2/2011 | Pandey et al. | | |
| 2012/0138493 A1* | 6/2012 | Tung-Ke | | G11B 33/124 206/320 |

* cited by examiner

700

710 — Support a top surface of a component of a computing system based on first supports and second supports of a mounting frame, the first supports to contact the top surface of the component at a first height relative to the mounting frame, and the second supports to contact the top surface of the component at a second height relative to the mounting frame 720 — Support the component in the mounting frame, wherein the mounting frame is mountable in the computing system

*FIG. 7*

MOUNTING FRAME AND SUPPORTS TO MOUNT A COMPONENT OF A COMPUTING SYSTEM

CROSS-REFERENCE TO RELATED APPLICATION

This application is a national stage application under 35 U.S.C. §371 of PCT/US2011/039623, filed Jun. 8, 2011.

BACKGROUND

A computing system is associated with components, such as a hard disk drive (HDD) or solid-state drive (SSD). Although the component can be associated with a form factor to fit within a compartment of the computing system, dimensions of the component may vary. Such components can be mounted by rigid fasteners such as screws. However, rigid fasteners can increase delay and complexity associated with removing and installing the component, and computing systems such as portable notebook computers can transmit vibration and shock to the component through the rigid fasteners.

BRIEF DESCRIPTION OF THE DRAWINGS/FIGURES

FIG. 7 is a flow chart based on a mounting frame according to an example.

The present examples will now be described with reference to the accompanying drawings. In the drawings, like reference numbers may indicate identical or functionally similar elements.

DETAILED DESCRIPTION

A computing system may use a drive caddy, to mount a component associated with a given form factor without the use of screws or other fasteners. However, components such as hard disk drives (HDDs) associated with a 2.5 inch form factor, may include models with heights of 7 millimeters (mm), 9.5 mm, and 12.5 mm. Multiple different dedicated drive caddies are used to accommodate each component having a particular set of dimensions. Accordingly, when a user upgrades the component (e.g., upgrading to a higher capacity HDD having a greater height), the existing drive caddy will not fit the upgraded component. A mounting frame as described herein accommodates variations in dimensions for different sizes of the component. Thus, the mounting frame can support different sized components (e.g., components associated with different capacities) using one re-usable mounting frame. Furthermore, the mounting frame can provide consistent retention, support, and shock absorption for the component, regardless of the component dimensions, while enabling efficient tool-less installation of the component in a computing system.

Figure 1:
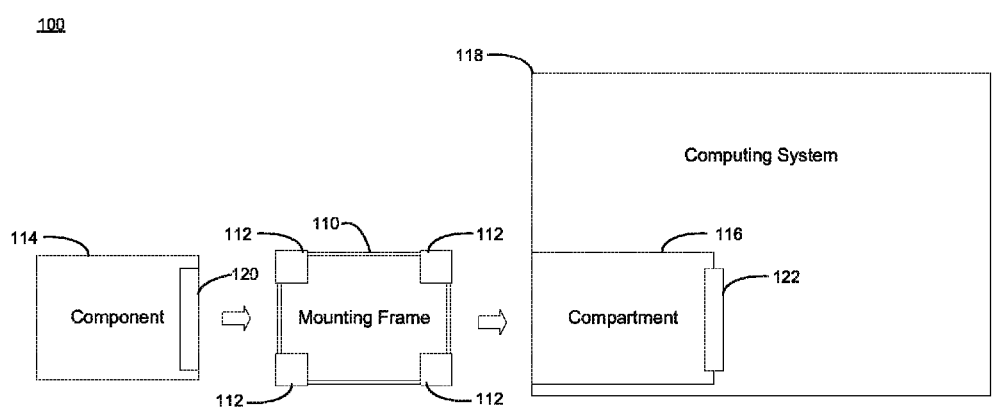
FIG. 1 is a block diagram of a system including a mounting frame, component, and computing system according to an example.

FIG. 1 is a block diagram of a system 100 including a mounting frame 110, component 114, and computing system 118 according to an example. The mounting frame 110 is to mount component 114 in compartment 116 of computing system 118. The component 114 may include a component interface 120 to communicate with computing system 118 via computing system interface 122.

Computing system 118 can be a notebook computer, netbook, tablet, or other device that can accept component 114. Component 114 may include a storage device such as a hard disk drive (HDD) or solid-state drive (SSD), and may include other devices such as an optical disk drive, memory, a network card, a wireless card, or other devices and expansion cards associated with computing system 118.

Component 114 can be associated with a form factor to fit within compartment 116 of the computing system 118. Mounting frame 110 may be used to mount component 114 of a given form factor and having various dimensions, while providing component retention, stabilization, shock absorption, and tool-less installation.

Mounting frame 110 may include supports 112 to mount component 114. Supports 112 may adapt to the dimensions of component 114. Supports 112 may support component 114 relative to computing system 118, e.g., via contact with inner surfaces of compartment 116. Mounting frame 110 may use techniques to mount component 114 including friction and elastic deformation of supports 112 and/or mounting frame 110. Mounting frame 110 may also include portions that protrude inward to interact with and retain component 114, such as bumps and/or extensions, to position and/or retain component 114 within mounting frame 110, without the use of fasteners such as screws that are installed using a tool. Bumps and/or extensions may be positioned with respect to mounting frame 110 based on component 114 and/or compartment 116, or other features.

Mounting frame 110 may be constructed of shock absorbing material. Supports 112 may provide retention, stabilization, shock absorption, and other benefits based on the material of construction, and also based on the geometry and arrangement of supports 112. Mounting frame 110 may be constructed based on molding, for example molded as a single component. Mounting frame 110 may be constructed based on co-molding, co-injection molding, dual-injection molding and/or dual-shot molding, with different materials injected during molding to form various parts. For example, supports 112 may be formed of a different material, such as plastic, compared to the material of mounting frame 110, such as rubber, bonded together as a unitary structure based on co-molding. Thus, supports 112 may have a higher rigidity compared to remaining portions of mounting frame 110, and mounting frame 110 may have a higher pliability and compressibility compared to supports 112. Mounting frame 110 and/or supports 112 may be composed of pliable material that can bend without breaking, and may be compressible. Example materials include rubber, plastic, metal, composite, and other materials, including combinations of materials (e.g., a plastic portion having at least a portion covered by rubber).

Mounting frame 110 may be used to install component 114 by hand, without the use of tools or tool-operated fasteners. Component 114 may be positioned within mounting frame 110, with supports 112 configured to accommodate variations in dimensions of component 114, if applicable. For example, in the top-down orientation illustrated in FIG. 1, component 114 may be inserted through a bottom of mounting frame 110, such that a top surface of component 114 comes in contact with a bottom surface of supports 112. Mounting frame 110 may snap into place over the top of component 114, frictionally engaging component 114. Portions of mounting frame 110, such as bumps and/or extensions that protrude inward, may be deflected during insertion of component 114 to allow insertion, and snap into place thereby retaining component 114. The mounting frame 110 may be inserted into compartment 116 while containing component 114, so that component interface 120 can mate with computing system interface 122. Computing system 118 may include a door, panel, latch, or other type of retention mechanism to retain mounting frame 110 and component 114 with respect to compartment 116. Mounting frame 110 may incorporate a door, panel, latch, or other type of retention mechanism such that a corresponding portion of mounting frame 110 forms an exposed portion of computing system 118 (e.g., a portion of mounting frame 110 forms a portion of the body/housing of computing system 118).

When component 114 is mounted to computing system 118, at least a portion of mounting frame 110 may be positioned between at least a portion of component 114 and compartment 116. For example, mounting frame walls may isolate sides of the component 114 from the computing system 118, and protrusions from the mounting frame (supports 112, bumps and/or extensions) may isolate a top and/or bottom of the component 114 from computing system 118. Portions of mounting frame 110 may provide shock absorption based on the thickness and compressibility of the material of mounting frame 110. Support 112 similarly may provide shock absorption with respect to an upper surface of the compartment 116 based on the material of the support 112, as well as based on the configuration of the support 112. Additional features may provide additional forms of stabilization, retention, and shock absorption, such as geometric arrangement and features of mounting frame 110 and/or supports 112. References to mounting frame 110 may include references to supports 112.

Figure 2:
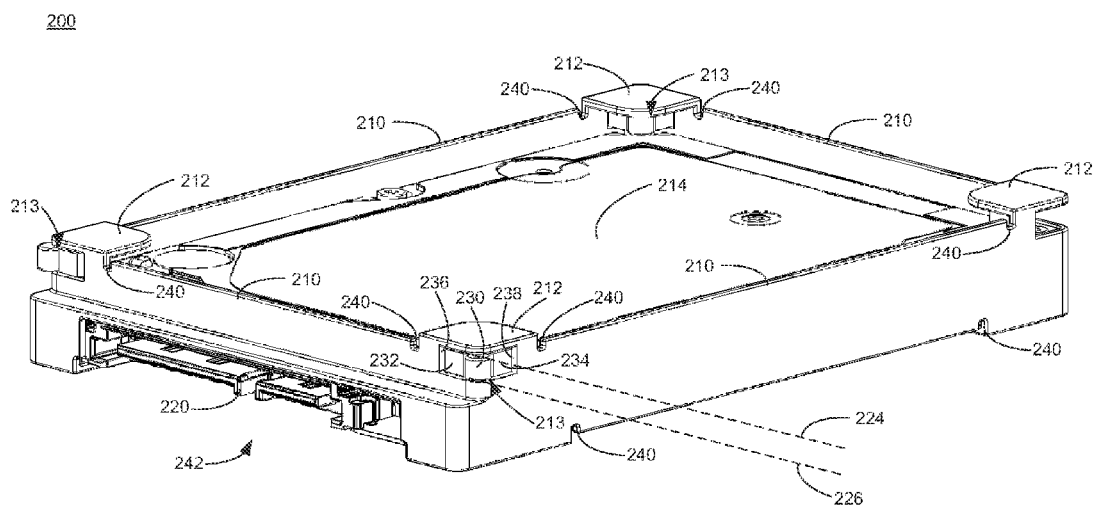
FIG. 2 is a perspective view of a mounting frame according to an example.

FIG. 2 is a perspective view of a mounting frame 200 according to an example, mounting a component 214 having component interface 220. Mounting frame 200 includes side walls 210, illustrated as solid/filled walls. In alternate examples, side walls 210 may have a framework or lattice support structure formed by the inclusion of spaces or holes in side walls 210. Desirable benefits may be obtained by varying the geometry (e.g., length, height, thickness) of side walls 210, as well as by varying the material of side walls 210. A more pliable or less pliable material can be used for side walls 210. Mounting frame 200 further includes first supports 212, second supports 213, and interface cutout 242.

First supports 212 may provide support to a top surface of component 214 at a first height 224 relative to the mounting frame 200. In the illustrated example of FIG. 2, first height 224 may correspond to a component 214 height of 12.5 millimeters (mm), associated with a 2.5 inch form factor (e.g., a hard disk drive). As illustrated, a top surface of component 214 does not come in direct contact with first supports 212, because the illustrated component 214 corresponds to a second height 226 relative to the mounting frame 200, e.g., a component 214 height of 9.5 mm. A support force provided by first supports 212 can be transmitted through second supports 213 to a top surface of component 214 positioned at second height 226, even though a top of the component 214 does not directly contact first supports 212.

Mounting frame 200 can retain component 214 within the mounting frame 200. For example, mounting frame 200 may rely on friction provided by side walls 210, first supports 212, and/or second supports 213. Mounting frame 200 may include protrusions from the mounting frame 200, such as extensions or bumps that extend inward from the mounting frame 200 to provide a retention surface that can be deflected to allow installation of component 214. Mounting frame 200 also may be dimensioned to provide friction to retain component 214, and may be composed of material (e.g., rubber) that has a coefficient of friction to produce a desired retention force when in contact with component 214, while facilitating component installation.

When the mounting frame 200 is installed in computing system 118 (see FIG. 1), first supports 212 may contact an inner surface of compartment 116, to anchor mounting frame 200 with respect to computing system 118. A geometry, such as surface area of first supports 212, can be varied, along with the characteristics of materials used to construct first supports 212, to provide varying levels of support and shock absorption for the component 214. First supports 212 may also provide structural support for maintaining a shape of the mounting frame 200, by spanning two side walls 210 at each corner of mounting frame 200 as brackets for structural support of the mounting frame 200. As illustrated, lower surfaces of first supports 212 provide support at first height 224. First height 224 may also be associated with the top surface of second supports 213.

Second supports 213 provide support to a top surface of component 214 at second height 226 relative to the mounting frame 200. Second height 226 may correspond to a component height of 9.5 mm for a 2.5 inch form factor in the example illustrated in FIG. 2. Second supports 213 are positionable in a first position (as illustrated in two corners of the mounting frame 200 located at the lower left of FIG. 2) and a second position (as illustrated in two corners of the mounting frame 200 located at the upper right of FIG. 2). The first position of the second supports 213 can accommodate the component 214 in contact with the first supports 212 at the first height 224 relative to the mounting frame 200. The second position of the second supports 213 positions the seconds supports 213 to contact a top surface of the component 214 at the second height 226 relative to the mounting frame 200.

Second supports 213 may provide support sufficient to mount component 214, including isolating the component 214 from movement, providing shock absorption, and other benefits. Additionally, second supports 213 can contact first supports 212 to transmit support from an inner surface of compartment 116 (see FIG. 1) to a top surface of the component 214 via first supports 212 and second supports 213. Thus, first supports 212 and second supports 213 may cooperate with each other to share in supporting component 214. Second supports 213 also may provide support to side surfaces of component 214 when second supports 213 are positioned in the first position to accommodate the component mounted at the first height 224. Second supports 213 are illustrated in the first position in the lower left corners of mounting frame 200 of FIG. 2. Thus, second support 213 can provide consistent support force and shock absorption to component 214 by distributing loads through first support 212. Second support 213 can provide consistent support and shock absorption when in the second position (illustrated in the top right of FIG. 2) to support component 214, and can provide a consistent retention force when in the first position to allow a component to be installed at the first height 224.

Second supports 213 can include a contact area 230. Contact area 230 of FIG. 2 is illustrated as a generally cylindrical section, although various arrangements are possible. Contact area 230 is joined to side walls 210 of mounting frame 200 by first support side 232 and second support side 234. Additional portions of second supports 213 may be used for contacting component 214 and/or first supports 212, such as the entire top and/or bottom surfaces of second supports 213, including first support side 232 and second support side 234.

Geometry and arrangement of second support 213 can be varied to provide support to component 214, and can be varied in view of the pliability and compressibility of material forming the second support 213. Second support 213 may be mounted to side walls 210 using living hinges, or other pivotable structures, such as barrel hinges, pivot hinges, cantilevered hinges, and flexure hinges, as well as hinges using combinations of features, such as pivot-flexure hinges. Second support 213 may be biased toward the first or second positions, such that they are dynamically unstable when in intermediate positions and snap into first or second positions when manipulated. A detent may be used to provide tactile feedback associated with first and second positions (e.g., used in conjunction with rotating or hinged structures). Living hinges can be formed using co-molding or other types of molding, such that different materials may be molded for at least portions of the living hinge. Mounting frame 200 and positionable second supports 213 may be comprised of one unitary part, without using an assembly of multiple parts associated with assembly.

First support side 232 of second support 213 may be joined to a side wall 210 by first joint 236. Second support side 234 of second support 213 may be joined to another side wall 210 by second joint 238. Joints also may be used between first support side 232 and contact area 230, and between contact area 230 and second support side 234. First support side 232 and second support side 234 may join contact area 230 at various locations along the circumference of contact area 230, such as at 180 degrees, 90 degrees, and other degrees of separation from one another along contact area 230. Thus, contact area 230 in the first position and the second position, located relative to the component 214 and side walls 210, may be adjusted by varying the position where first support side 232 and second support side 234 join the contact area 230. For example, if first support side 232 and second support side 234 join the contact area 230 at nearly the same point, the contact area 232 will be located farther outward, compared to example where first support side 232 and second support side 234 join the contact area 230 separated from each other.

Contact area 230 may protrude outward beyond the plane of side wall(s) 210 when the second support 213 is in the first position, as illustrated in the leftmost corner of the mounting frame 200 in FIG. 2. Such a configuration may enable contact area 213 to apply a retention force to a side of component 214 mounted at the first height 224, when pressed inward by contact with an inner surface of compartment 116 (see FIG. 1). Contact area 230 may be a solid form, and may also be a hollow/partial outline or a joint formed by joining first support side 232 and second support side 234.

Interface cutout 242 provides a pass-through for component interface 220. As illustrated, component interface 220 is a Serial Advanced Technology Attachment (SATA) interface including a power connector, although interface cutout 242 can be formed to accommodate other interfaces used by component 214 and/or a computing system.

Mounting frame 200 may include cutouts 240. Cutouts 240 may provide a curved transition at corners that would otherwise include sharp transitions, to increase strength, flexibility, and resistance to tearing in portions of mounting frame 200. Cutouts 240 enable mounting frame 200 to be deformed and deflected without putting excessive strain on corners, e.g., points where a geometry of mounting frame 200 transitions from one line to another. Cutouts 240 can introduce smooth curves into the construction of mounting frame 200 for absorbing tension and stresses that mounting frame 200 may experience, such as during installation of component 214 into mounting frame 200 and installation of mounting frame 200 into compartment 116 of computing system 118.

Figure 3:
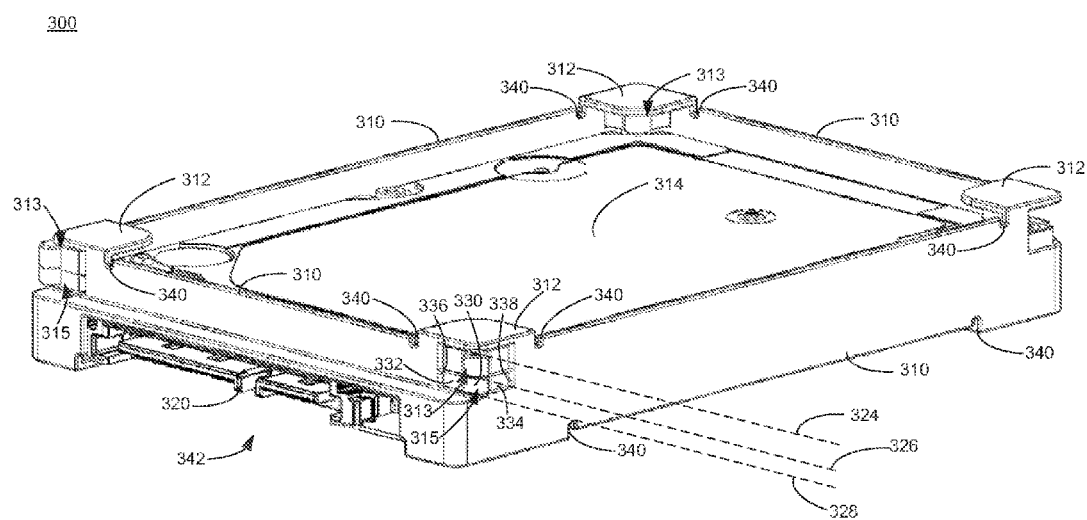
FIG. 3 is a perspective view of a mounting frame according to an example.

FIG. 3 is a perspective view of a mounting frame 300 according to an example, including third supports 315. Mounting frame 300 includes side walls 310, first supports 312, second supports 313, and third supports 315. Mounting frame 300 further includes cutouts 340, and interface cutout 342 to accommodate component interface 320 of component 314.

First supports 312 may provide support to a top surface of component 314 when positioned at first height 324. Second supports 313 may provide support to a top surface of component 314 when positioned at second height 326. Third supports 315 may provide support to a top surface of component 314 when positioned at third height 328. In the example illustrated in FIG. 3, first height 324 corresponds to a component 314 height of 12.5 mm, second height 326 corresponds to 9.5 mm, and third height 328 corresponds to 7 mm. Thus, illustrated component 314 has a height of 9.5 mm, and its top surface is in contact with second supports 313 at second height 326 when second supports 313 are positioned in a second position for support. The second supports 313 are illustrated in FIG. 3 in both the second position (at the top of FIG. 3) and a first position capable of accommodating a component in contact with first supports 312 (at the bottom and left of FIG. 3, e.g., positioned to accommodate a component having a height of 12.5 mm, not illustrated). The rightmost corner of mounting frame 300 in FIG. 3 does not illustrate third support 315, to reveal an underlying corner of component 314.

Third support 315 can include a contact area 330. Contact area 330 may be joined to side walls 310 of mounting frame 300 by first support side 332 and second support side 334, and may be joined using first joint 336 and second joint 338. Contact area 330 may be a joint to join first support side 332 and second support side 334. First support side 332 and second support side 334 may be joined to contact area 330 using joints. Joints may be formed by living hinges or other techniques.

At least a portion of third support 315, such as contact area 330, first support side 332, and second support side 334, is to contact second support 313. Similarly, second support 313 is to contact first support 312, which is to contact an inner surface of compartment 116 (see FIG. 1) of computing system 118. Accordingly, third support 315 can provide consistent support and shock absorption to component 314 by distributing loads through second support 313 and first support 312. Third support 315 by itself can provide consistent support and shock absorption when in the second position to support component 314, and can provide a consistent retention force to a side of component 314, when in the first position to accommodate a component at the second height 326 or the first height 324.

Figure 4:
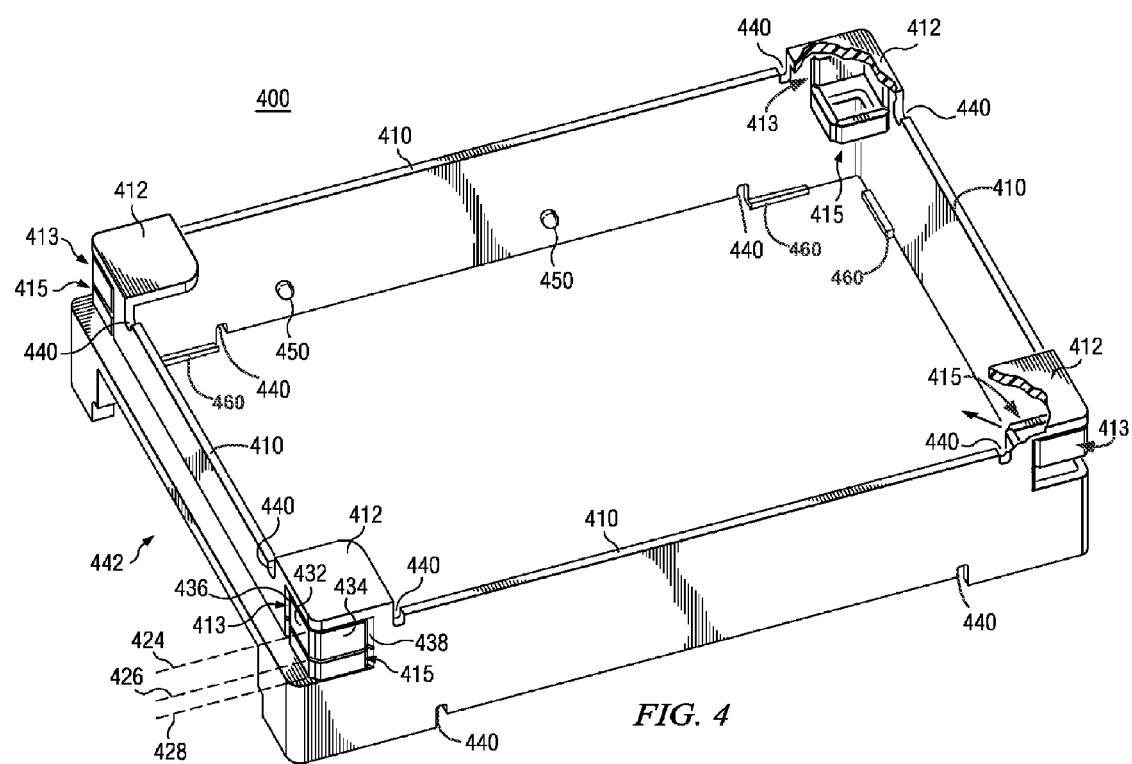
FIG. 4 is a perspective view of a mounting frame according to an example.

FIG. 4 is a perspective view of a mounting frame 400 according to an example. Mounting frame 400 includes example second supports 413 and third supports 415, as well as bumps 450 and extensions 460.

Mounting frame 400 may be used to mount a component in contact with side walls 410, bumps 450, extensions 460, first supports 412, second supports 413, and/or third supports 415. Interface cutout 442 may accommodate a component interface, and cutouts 440 may be used to smooth corners of mounting frame 400. First supports 412, second supports 413, and/or third supports 415 may be used to mount the component at corresponding first height 424, second height 426, and third height 428.

Second support 413 may be formed by joining first support side 432 to second support side 434, for example by using a living hinge. Third support 415 may be formed similarly. Second support 413 (and similarly third support 415) may be joined to side walls 410 by first joint 436 and second joint 438. Thus, second support 413 and third support 415 are illustrated not including a cylindrical contact area as in the examples of FIGS. 2 and 3. The first support side 432 and the second support side 434 may be formed to serve as contact areas (see, e.g., the top right and bottom right corners of mounting frame 400 in FIG. 4 illustrating third supports 415 in the second position). A cylindrical, or other shaped, contact area may be incorporated into the first support side 432 and/or the second support side 434, e.g., forming multiple individual contact areas for second support 413 and third support 415, respectively.

Bumps 450 and extensions 460 may be used to position and retain the component within the mounting frame 400. For example, bumps 450 may correspond to screw holes in the component. Bumps 450 and extensions 460 may be deflected outward during installation of the component, springing back into place when the component is in proper position. Bumps 450 and extensions 460 may incorporate slanted surfaces to facilitate deflection during installation and/or removal. Thus, a component may be installed and retained in mounting frame 400 by hand without the use of tools. Extensions 460 are illustrated as projecting from side wall 410 by an amount comparable to the thickness of a side wall 410. However, extensions 460 may protrude by a greater or lesser amount. As described above regarding materials of construction, bumps 450 and/or extensions 460 may be constructed of materials having various properties to provide stability, retention, shock absorption, friction, and other benefits for mounting the component.

Extensions 460 may provide a separation between a bottom of the mounted component and a surface of compartment 116 of computing system 118 (see FIG. 1). Varying the dimensions, geometry, structure and other characteristics of extensions 460 may effectively isolate the component from the surface of the compartment 116 to prevent damage from shocks, e.g., when computing system 118 is dropped onto a floor.

Figure 5:
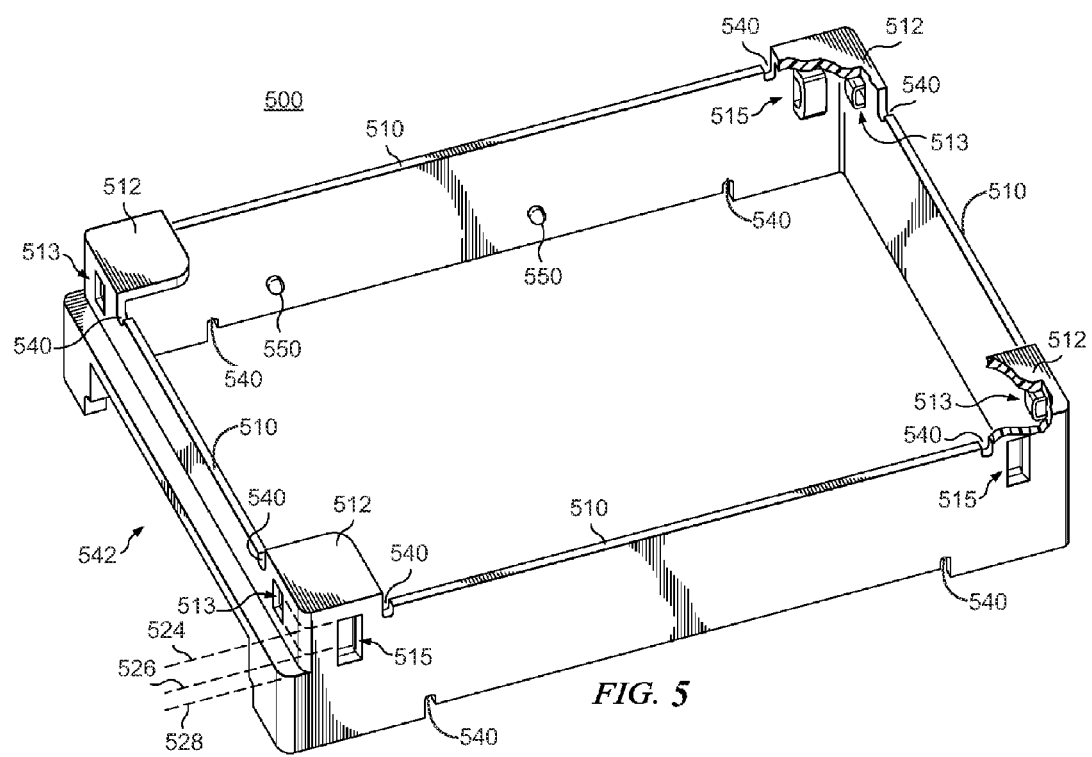
FIG. 5 is a perspective view of a mounting frame according to an example.

FIG. 5 is a perspective view of a mounting frame 500 according to an example. Mounting frame 500 includes example second supports 513 and third supports 515, as well as bumps 550.

Mounting frame 500 may be used to mount a component in contact with side walls 510, bumps 550, first supports 512, second supports 513, and/or third supports 515. Interface cutout 542 may accommodate a component interface, and cutouts 540 may be used to smooth corners of mounting frame 500. First supports 512, second supports 513, and/or third supports 515 may be used to mount the component at corresponding first height 524, second height 526, and third height 528.

Second support 513 (and third support 515) may be formed as a section including a curve or similar shape, joined to side wall 510 at a top and bottom of second support 513. Second support 513 may be joined to side wall 510 using a living hinge or other joint. An upper portion of second support 513 (and third support 515) may be structured to contact the first support 512. Thus, first support 512 may provide support to second support 513 and third support 515, increasing the support for a component mounted in mounting frame 500. A lower portion of second support 513 (and third support 515) may be structured to contact a top surface of the component when mounted. Third support 515 is taller than second support 513, so that second support 513 and third support 515 both may contact first support 512, while capable of providing support at second height 526 or third height 528.

Second support 513 and third support 515 may assume a default position extending inward, and may be deflected outward to accommodate a height of the component to be mounted. Dimensions, materials, and construction/geometry of second support 513 and third support 515 may be varied to adjust a level of support and resistance to deflection. For example, a width of second support 513 can be varied to compensate for its height, in comparison to third support 515 which may be taller than second support 513, whose width may similarly be varied. Thicknesses and other characteristics of second support 513 and third support 515 may also be varied for desired interaction in mounting a component.

A component mounted at first height 524 will deflect second support 513 and third support 515 so that a top surface of the component can contact first support 512. A component mounted at second height 526 will contact a bottom surface of second support 513, and deflect at least a portion of third support 515. A component mounted at third height 528 will contact a bottom surface of third support 515.

The second support 513 and third support 515 can be deflected within the space located in the side wall 510 corresponding to the respective second support 513 or third support 515. In alternate examples, second support 513 and third support 515 can be deflected outward beyond the plane of side wall 510, to contact an inner surface of compartment 116 of computing system 118 (see FIG. 1). Accordingly, second support 513 and third support 515 may provide a first resistance to deflection while the mounting frame 500 is outside compartment 116, and a second resistance to deflection while the mounting frame 500 is inside compartment 116. Varying resistance to deflection can be associated with an ease of installation and variation in friction between supports and the component (e.g., higher resistance to deflection can result in greater grip on the component).

Portions of second support 513 and third support 515 may interact with compartment 116 during an installation of mounting frame 500 into compartment 116. For example, one end of second support 513 and third support 515 may be unconnected to side wall 510, to allow the unconnected end to deflect outside the plane of side wall 510 as the support pivots about its connected end during deflection. The supports may include slanted surfaces to cooperate with the mouth of compartment 116 during installation, deflecting the support inward during insertion of the mounting frame 500 and component into compartment 116, thereby increasing a grip/retention of the supports on the mounted component after the component has been installed in mounting frame 500.

Bumps 550 may provide retention by aligning with screwholes associated with the form factor of the component, as in the example of FIG. 4. Similar to second support 513 and third support 515, bumps 550 may be mounted on a deflectable portion of mounting frame 500, to facilitate installation as well as to increase grip when mounting frame 500 is installed into compartment 116 of computing system 118.

Figure 6:
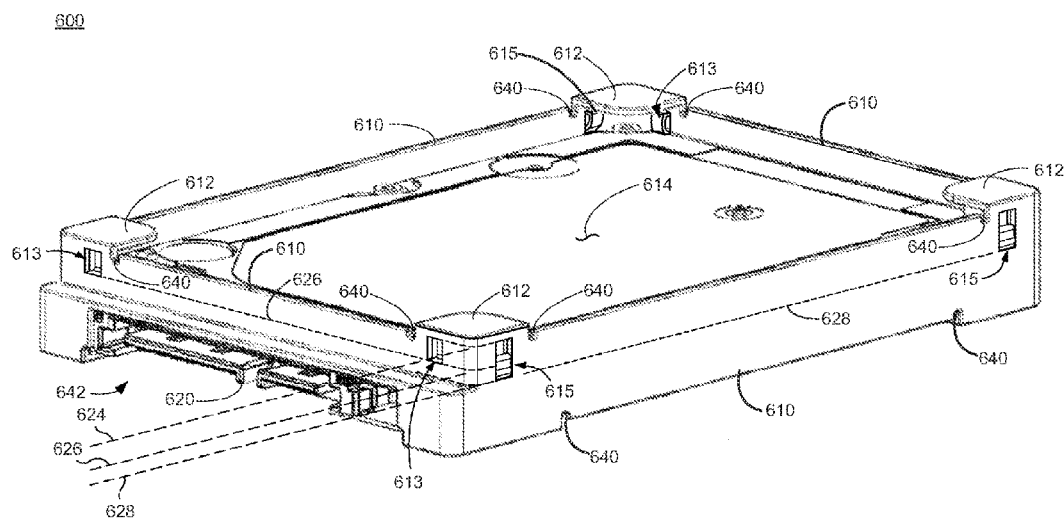
FIG. 6 is a perspective view of a mounting frame according to an example.

FIG. 6 is a perspective view of a mounting frame 600 according to an example. Mounting frame 600 includes side walls 610, first supports 612, second supports 613 and third support 615 to mount component 614 at first height 624, second height 626, or third height 628. Second supports 613 and third supports 615 are deflectable, similar to the example of FIG. 5. Deflectable supports may also be provided as a tab-shaped cutout in mounting frame 600, including an inward protrusion. Mounting frame 600 includes cutouts 640, and an interface cutout 642 associated with component interface 620.

Component 614 is shown mounted at second height 626. A top surface of component 614 contacts a bottom surface of second support 613. A top surface of second support 613 contacts a bottom surface of first support 612. Thus, a support force from first support 612 is transferred to a top surface of component 614 through second support 613. Mounting frame 600 can effectively take up any slack at a top surface of component 614, while providing consistent support regardless of height and protecting the component 614 from moving due to shock or other movements.

Third support 615 is illustrated as deflected, such that a portion of third support 615 occupies the space within side wall 610 and a portion protrudes inward above component 614. The portion of third support 615 protruding inward may cooperate with second support 613 to provide additional support, retention, and shock absorption to component 614. Third support 615 also may include multiple parts that interact with each other to deflect in a controlled manner to fold at the second height 626 when a component 614 of the corresponding height is mounted, facilitating installation and retention/grip of the component 614.

FIG. 7 is a flow chart 700 based on a mounting frame according to an example. In step 710, a mounting frame supports a top surface of a component of a computing system based on first supports and second supports, the first supports to contact the top surface of the component at a first height relative to the mounting frame, and the second supports to contact the top surface of the component at a second height relative to the mounting frame. For example, the second supports can be positioned in a second position to contact a component associated with the second height. In step 720, the component is supported in the mounting frame, wherein the mounting frame is mountable in the computing system. Thus, a mounting frame can accommodate different components having different dimensions. The mounting frame can effectively retain the component in the mounting frame, and provide consistent support and shock absorption, based on a consistent fit regardless of the height of the component.

The breadth and scope of the present invention should not be limited by any of the above-described examples, but should be defined in accordance with the following claims and their equivalents.

What is claimed is:

1. A mounting frame to mount a component of a computing system, comprising:
   first supports mounted at a first height relative to the mounting frame to contact, at the first height, a top surface of a first component having a first component height; and
   second supports mounted at a second height relative to the mounting frame, the second supports deflected by the mounting frame when the top surface of the first component is contacted to the first supports at the first height, and
   a bottom surface of the second supports to contact, at the second height, the top surface of a second component having a second component height less than the first component height.

2. The mounting frame of claim 1, wherein each of the second supports includes a first position to accommodate the first component in contact with the first supports at the first height, and a second position to contact the top surface of the second component at the second height.

3. The mounting frame of claim 2, wherein each of the second supports is movable between the first position and the second position based on a living hinge.

4. The mounting frame of claim 1, wherein each of the second supports is deflectable from a default position to another position in response to an installation force, to accommodate the first component in contact with the first supports at the first height.

5. The mounting frame of claim 1, further comprising third supports mounted at a third height relative to the mounting frame, wherein the third supports are deflected by the first component when the first component is contacted to the first supports or by the second component when the second component is contacted to the second supports, and
   a bottom surface of the third supports to contact, at the third height, the top surface of a third component having a third component height less than the second component height.

6. An adapter comprising:
   a mounting frame to mount a component of a computing system;
   first supports associated with the mounting frame to contact, at a first height relative to the mounting frame, a top surface of a first component having a first component height; and
   second supports associated with the mounting frame, each of the second supports deflectable by the first component in contact with the first supports at the first height, and
   the second supports to contact, at a second height relative to the mounting frame, the top surface of a second component having a second component height less than the first component height.

7. The adapter of claim 6, wherein the first supports comprise corner brackets to support a top surface of the second supports.

8. The adapter of claim 6, wherein each of the second supports comprises a support side joined to the mounting frame by a living hinge.

9. The adapter of claim 6, wherein each of the second supports comprises a contact area to contact the top surface of the second component.

10. The adapter of claim 6, further comprising third supports associated with the mounting frame, each of the third supports deflectable by the first component in contact with the first supports at the first height or by the second component in the contact with the second supports at the second height, and
   each of the third supports to contact, at a third height relative to the mounting frame, the top surface of a third component having a third component height less than the second component height.

11. A method, comprising:
   supporting a top surface of a component of a computing system based on first supports and second supports of a mounting frame, wherein the supporting comprises:
      for a first component having a first component height, contacting the first supports to the top surface of the first component at a first height relative to the mounting frame, and deflecting the second supports by the first component that has the first component height, and for a second component having a second component height less than the first component height, contacting the second supports to the top surface of the second component at a second height relative to the mounting frame; and supporting the first or second component in the mounting frame, wherein the mounting frame is mountable in the computing system.

12. The method of claim 11, further comprising, for a third component having a third component height less than the second component height, contacting third supports of the mounting frame to the top surface of the third component at a third height relative to the mounting frame, wherein the third supports are deflected by the first component when the first component is contacted to the first supports or by the second component when the second component is contacted to the second supports.

13. The method of claim 11, further comprising retaining the first or second component in the mounting frame, and providing support and shock absorption, based on providing a consistent fit regardless of the height of the first or second component.

14. The method of claim 11, wherein deflecting the second supports comprises deflecting the second supports from a default position to another position to accommodate the first component in contact with the first supports.

15. The method of claim 11, further comprising accommodating a component interface in an interface cutout in the mounting frame.

16. The mounting frame of claim 5, wherein the third supports are longer than the second supports.

17. The mounting frame of claim 1, wherein the first height and second height are both measured from a common reference point of the mounting frame.

18. The method of claim 12, wherein the third supports are longer than the second supports.

19. The method of claim 11, wherein deflecting the second supports comprises pivoting the second supports from a first position to a second position.

20. The method of claim 11, wherein contacting the second supports to the top surface of the second component at the second height comprises contacting a bottom surface of the second supports to the top surface of the second component at the second height.

21. The method of claim 11, wherein deflecting the second supports comprises deflecting the second supports outwardly beyond a plane of a side wall of the mounting frame, and contacting the deflected second supports to an inner surface of a compartment of the computing system.

* * * * *